US009792868B2

(12) United States Patent
Wang

(10) Patent No.: US 9,792,868 B2
(45) Date of Patent: Oct. 17, 2017

(54) SHIFT REGISTER UNIT, GATE DRIVING DEVICE AND DISPLAY DEVICE

(71) Applicants: Boe Technology Group Co., Ltd., Beijing (CN); Beijing Boe Display Technology Co., Ltd., Beijing (CN)

(72) Inventor: Zheng Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 63 days.

(21) Appl. No.: 14/913,318

(22) PCT Filed: Aug. 3, 2015

(86) PCT No.: PCT/CN2015/085941
§ 371 (c)(1),
(2) Date: Feb. 19, 2016

(87) PCT Pub. No.: WO2016/161725
PCT Pub. Date: Oct. 13, 2016

(65) Prior Publication Data
US 2017/0039969 A1    Feb. 9, 2017

(30) Foreign Application Priority Data
Apr. 9, 2015    (CN) .......................... 2015 1 0165136

(51) Int. Cl.
*G09G 3/36*    (2006.01)
*G11C 19/28*    (2006.01)

(52) U.S. Cl.
CPC ......... *G09G 3/3648* (2013.01); *G09G 3/3677* (2013.01); *G11C 19/287* (2013.01);
(Continued)

(58) Field of Classification Search
CPC .. G09G 3/3648; G09G 3/3677; G09G 3/3622; G09G 3/3674; G11C 19/287; G11C 19/28; G11C 19/00
(Continued)

(56) References Cited

U.S. PATENT DOCUMENTS

2007/0242000 A1    10/2007    Shin
2011/0310074 A1*   12/2011    Ochiai ................. G09G 3/3674
                                                        345/208

(Continued)

FOREIGN PATENT DOCUMENTS

CN    101335050 A    12/2008
CN    101826310 A    9/2010
(Continued)

OTHER PUBLICATIONS

Office action from Chinese Application No. 201510165136.2 dated Sep. 19, 2016.
(Continued)

*Primary Examiner* — Fred Tzeng
(74) *Attorney, Agent, or Firm* — Calfee, Halter & Griswold LLP

(57) ABSTRACT

The present disclosure provides a shift register unit including a pull-up module, an input module, a reset module, a first pull-down module, a second pull-down module, a first control module, a second control module, a first state clearing module, and a second state clearing module. The shift register unit utilizes a first clock signal and a second clock signal to cause the first and second pull-down modules to pull down alternately, in order to maintain the stability of the output signal. Furthermore, each of the TFTs in the circuit structure has a duty cycle smaller than 50%, so that the lifetime of TFTs is greatly increased. The present dis-
(Continued)

closure further provides a gate driving device and a display device using the shift register unit.

13 Claims, 4 Drawing Sheets

(52) U.S. Cl.
CPC . *G09G 2300/04* (2013.01); *G09G 2310/0286* (2013.01); *G09G 2310/08* (2013.01)

(58) Field of Classification Search
USPC .......................................................... 345/213
See application file for complete search history.

(56) References Cited

U.S. PATENT DOCUMENTS

| | | | | |
|---|---|---|---|---|
| 2011/0316831 A1* | 12/2011 | Ochiai | ................. | G09G 3/3677 345/208 |
| 2012/0093276 A1* | 4/2012 | Wang | .................... | G11C 19/28 377/78 |
| 2014/0176410 A1* | 6/2014 | Ma | ....................... | G09G 3/3622 345/92 |
| 2015/0043704 A1* | 2/2015 | Ma | ....................... | G09G 3/3677 377/68 |
| 2015/0043705 A1* | 2/2015 | Wang | .................... | G11C 19/28 377/77 |
| 2015/0255031 A1* | 9/2015 | Cao | ...................... | G09G 3/3648 345/210 |
| 2016/0133337 A1* | 5/2016 | Gu | ........................... | G09G 3/00 377/64 |
| 2016/0232865 A1* | 8/2016 | Hao | ...................... | G09G 3/3677 |
| 2016/0372023 A1* | 12/2016 | Zhang | ................. | G09G 3/2092 |
| 2017/0032750 A1* | 2/2017 | Shao | .................... | G09G 3/3648 |
| 2017/0039968 A1* | 2/2017 | Chen | .................... | G09G 3/3648 |

FOREIGN PATENT DOCUMENTS

| | | |
|---|---|---|
| CN | 102629459 | 8/2012 |
| CN | 102654986 | 9/2012 |
| CN | 202502720 U | 10/2012 |
| CN | 103021354 A | 4/2013 |
| CN | 103226979 A | 7/2013 |
| CN | 103258494 A | 8/2013 |
| CN | 104252853 A | 12/2014 |
| CN | 104361852 A | 2/2015 |
| CN | 104700769 | 6/2015 |
| EP | 1160796 | 12/2001 |
| KR | 20060129881 A | 12/2006 |

OTHER PUBLICATIONS

International Search Report and Written Opinion from PCT/CN15/85941 dated Jan. 11, 2016.

\* cited by examiner

SHIFT REGISTER UNIT, GATE DRIVING DEVICE AND DISPLAY DEVICE

RELATED APPLICATIONS

The present application is the U.S. national phase entry of PCT/CN2015/085941 with an International filing date of Aug. 3, 2015, which claims the benefit of Chinese Application No. 201510165136.2, filed Apr. 9, 2015, the entire disclosures of which are incorporated herein by reference.

RELATED APPLICATION

The present application claims the benefit of Chinese patent application No. 201510165136.2 filed on Apr. 9, 2015, all the disclosed contents of this Chinese patent application are incorporated herein by reference.

TECHNICAL FIELD

The present disclosure relates to the field of display technology, in particular to a shift register unit, and a gate driving device and a display device using the shift register unit.

BACKGROUND OF THE INVENTION

As a technology related to the existing driving circuit of a liquid crystal display device, GOA (Gate Driver on Array) technology has been developed in the art. A GOA circuit generally includes a plurality of cascaded shift register units, wherein each shift register unit is connected to a shift register unit of an adjacent row, corresponds to a row of gate line, and outputs a gate driving signal and at the same time provides the output signal to the next shift register unit to ensure that the next shift register would implement outputting of the gate driving signal in the next clock cycle.

In the prior art, a thin-film transistor (TFT) is generally employed to pull down the potential of the output signal of a shift register unit to low level. However, the duty cycle of the pull-down TFT is generally greater than 99%, leading to a rapid aging of the pull-down TFT, an occurrence of failure in the entire circuit, and an impact to the lifetime of product.

SUMMARY OF THE INVENTION

The object of the present disclosure is to provide a shift register unit, and a gate driving device and a display device using the shift register unit, to address some or all of the above described disadvantages.

According to one aspect of the present disclosure, a shift register unit is provided, which includes a pull-up module, an input module, a reset module, a first pull-down module, a second pull-down module, a first control module, a second control module, a first state clearing module, and a second state clearing module.

The pull-up module is connected to a first clock signal port, a pull-up control node (PU) and a signal output end, and configured to pull up a signal outputted from the signal output end to high level according to a potential of the pull-up control node and a first clock signal inputted to the first clock signal port, said pull-up control node being a connection point between the pull-up module and the input module; the input module is connected to a signal input end and the pull-up control node, and configured to control the potential of the pull-up control node according to a signal inputted to the signal input end; the reset module is connected to a reset signal end, the first clock signal port, the pull-up control node and the signal output end, and configured to pull down the potential of the pull-up control node and the signal outputted from the signal output end to low level according to a signal inputted to the reset signal end and the first clock signal; the first pull-down module is connected to the first clock signal port, a second clock signal port to which a second clock signal is inputted, a first control node, the pull-up control node and the signal output end, and configured to pull down the potential of the pull-up control node and the signal outputted from the signal output end to low level when the potential of the first clock signal is high and the potential of the second clock signal is low, the first control node being a connection point between the first pull-down module and the first control module; the second pull-down module is connected to the first clock signal port, the second clock signal port, a second control node, the pull-up control node and the signal output end, and configured to pull down the potential of the pull-up control node and the signal outputted from the signal output end to low level when the potential of the first clock signal is low and the potential of the second clock signal is high, the second control node being a connection point between the second pull-down module and the second control module; the first control module is connected to the signal output end and the first control node, and configured to disable the first pull-down module when a signal is outputted from the signal output end; the second control module is connected to the signal input end and the second control node, and configured to disable the second pull-down module when a signal is inputted to the signal input end; the first state clearing module is connected to the second clock signal port and the first control node, and configured to clear the state of the first pull-down module when the potential of the second clock signal is high; and the second state clearing module is connected to the first clock signal port and the second control node, and configured to clear the state of the second pull-down module when the potential of the first clock signal is high.

The above described shift register unit utilizes the first and second clock signals to cause the first and second pull-down modules to pull down alternately, in order to maintain the stability of the output signal. Furthermore, each of the TFTs in the circuit structure has a duty cycle smaller than 50%, so that the lifetime of TFTs is greatly increased.

According to another aspect of the present disclosure, a gate driving device is provided, which includes a plurality of shift register units as described above, wherein said plurality of shift register units are cascaded, and a signal output end of each shift register unit, except for the first shift register unit and the last shift register unit, is connected to an input end of an adjacent next shift register unit and to a reset signal end of an adjacent previous shift register unit; and wherein a frame start signal is inputted to a signal input end of said first shift register unit and a signal output end of said first shift register unit is connected to a signal input end of the second shift register unit, and a signal output end of said last shift register unit is connected to a reset signal end of an adjacent previous shift register unit.

In an embodiment, clock signals inputted to the first clock signal ports of two adjacent shift register units are opposite in phase, and clock signals inputted to the second clock signal ports of two adjacent shift register units are opposite in phase.

According to yet another aspect of the present invention, a display device is provided, which includes the gate driving device as described above.

This Summary is provided to introduce a selection of concepts in a simplified form which are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The above and other aspects of the present invention will be described now in more detail with reference to the drawings showing embodiments of the present invention.

DETAILED DESCRIPTION OF THE INVENTION

Following embodiments are provided by way of example to make the present disclosure exhaustive and complete and to convey the scope of the present invention entirely to persons skilled in the art. The present disclosure is set forth in the context of representative embodiments which are not intended to be restrictive in any way.

Transistors employed in all the embodiments of the present invention may be thin film transistors or field effect transistors or other devices having the same characteristics. In the embodiments of the present invention, the source and drain of each transistor may be used interchangeably and thus for ease of description, one of them is referred to as a first terminal and the other is referred to as a second terminal.

Figure 1:
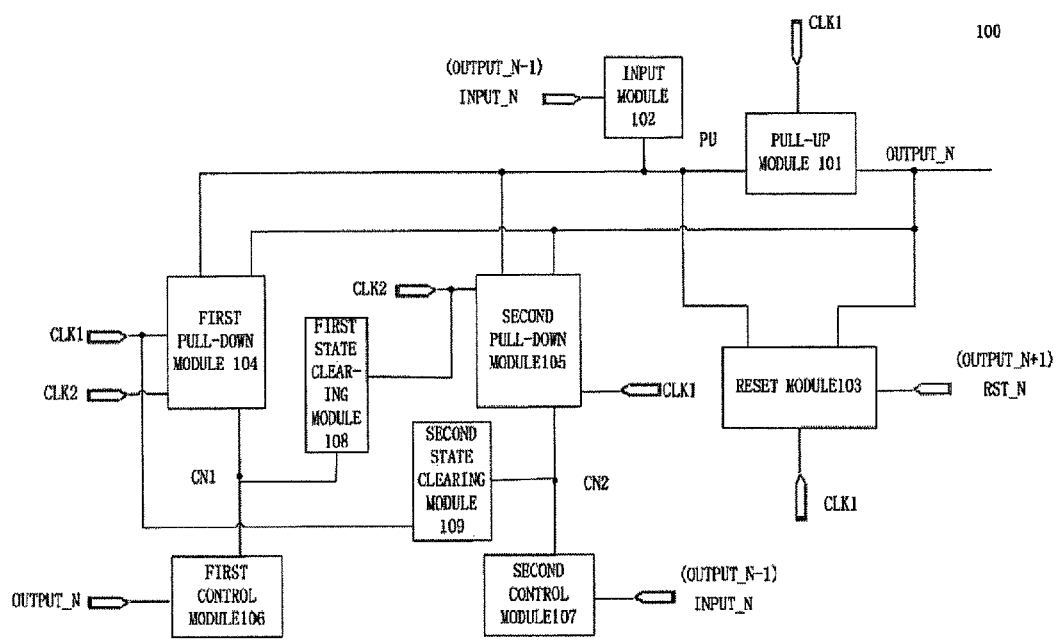
FIG. 1 illustrates a schematic diagram of a shift register unit according to an embodiment of the present disclosure.

FIG. 1 illustrates a schematic diagram of a shift register unit according to an embodiment of the present disclosure. As shown in FIG. 1, the shift register unit 100 includes a pull-up module 101, an input module 102, a reset module 103, a first pull-down module 104, a second pull-down module 105, a first control module 106, a second control module 107, a first state clearing module 108, and a second state clearing module 109. The pull-up module is connected to a first clock signal port CLK1, a pull-up control node PU and a signal output end OUTPUT_N (taking the Nth shift register unit in the cascaded structure as an example), and configured to pull up a signal outputted from the signal output end to high level according to a potential of the pull-up control node and a first clock signal inputted to the first clock signal port, wherein said pull-up control node is a connection point between the pull-up module and the input module. The input module is connected to a signal input end INPUT_N (which is generally connected to a signal output port OUTPUT_N−1 of the previous shift register unit) and the pull-up control node, and configured to control the potential of the pull-up control node according to a signal inputted to the signal input end. The reset module is connected to a reset signal end RST_N (which is generally connected to a signal output port OUTPUT_N+1 of the next shift register unit), the first clock signal port, the pull-up control node and the signal output end, and configured to pull down the potential of the pull-up control node and the signal outputted from the signal output end to low level according to a signal inputted to the reset signal end and the first clock signal inputted to the first clock signal port. The first pull-down module is connected to the first clock signal port, a second clock signal port CLK2 to which a second clock signal is inputted, a first control node CN1, the pull-up control node and the signal output end, and configured to pull down the potential of the pull-up control node and the signal outputted from the signal output end to low level when the potential of the first clock signal is high and the potential of the second clock signal is low, wherein the first control node is a connection point between the first pull-down module and the first control module. The second pull-down module is connected to the first clock signal port, the second clock signal port, a second control node CN2, the pull-up control node and the signal output end, and configured to pull down the potential of the pull-up control node and the signal outputted from the signal output end to low level when the potential of the first clock signal is low and the potential of the second clock signal is high, wherein the second control node is a connection point between the second pull-down module and the second control module. The first control module is connected to the signal output end and the first control node, and configured to disable the first pull-down module when a signal is outputted from the signal output end. The second control module is connected to the signal input end and the second control node, and configured to disable the second pull-down module when a signal is inputted to the signal input end. The first state clearing module is connected to the second clock signal port and the first control node, and configured to clear the state of the first pull-down module when the potential of the second clock signal is high. The second state clearing module is connected to the first clock signal port and the second control node, and configured to clear the state of the second pull-down module when the potential of the first clock signal is high.

Figure 2:
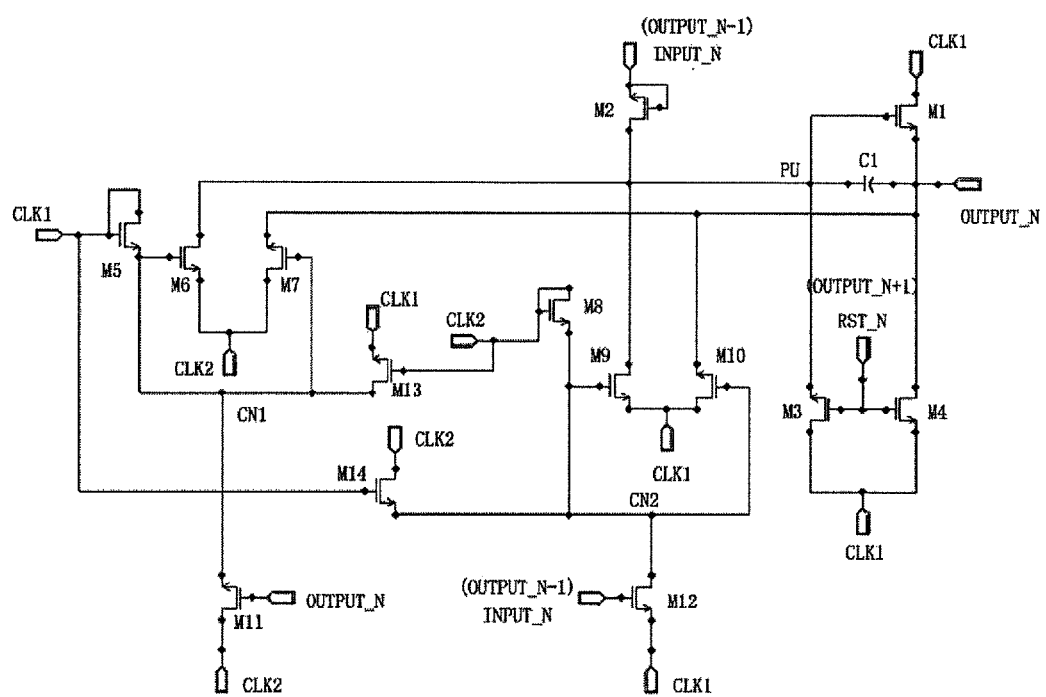
FIG. 2 illustrates a schematic structural diagram of a shift register unit according to an embodiment of the present disclosure.

FIG. 2 illustrates a schematic structural diagram of a shift register unit according to an embodiment of the present disclosure. As shown in FIG. 2, the pull-up control module includes: a first transistor M1, wherein a gate of the first transistor is connected to the pull-up control node PU, a first terminal of the first transistor is connected to the first clock signal port CLK1, and a second terminal of the first transistor is connected to the signal output end OUTPUT_N; and a first capacitor C1, wherein one end of the first capacitor is connected to the pull-up control node PU and the other end of the first capacitor is connected to the signal output end OUTPUT_N.

The input module includes a second transistor M2, wherein a gate and a first terminal of the second transistor are connected to the signal input end INPUT_N, and a second terminal of the second transistor is connected to the pull-up control node PU.

The reset module includes: a third transistor M3, wherein a gate of the third transistor is connected to the reset signal end RST_N, a first terminal of the third transistor is connected to the first clock signal port, and a second terminal of the third transistor is connected to the pull-up control node; and a fourth transistor M4, wherein a gate of the fourth transistor is connected to the reset signal end, a first terminal of the fourth transistor is connected to the signal output port, and a second terminal of the fourth transistor is connected to the first clock signal port.

The first pull-down module includes: a fifth transistor M5, wherein a gate and a first terminal of the fifth transistor are connected to the first clock signal port, and a second terminal of the fifth transistor is connected to the first control node; a sixth transistor, wherein a gate of the sixth transistor is connected to the first control node CN1, a first terminal of the sixth transistor is connected to the pull-up control node, and a second terminal of the sixth transistor is connected to the second clock signal port CLK2; and a seventh transistor M7, wherein a gate of the seventh transistor is connected to the first control node, a first terminal of the seventh transistor is connected to the signal output end, and a second terminal of the seventh transistor is connected to the second clock signal port.

The second pull-down module includes: an eighth transistor M8, wherein a gate and a first terminal of the eighth transistor are connected to the second clock signal port, and a second terminal of the eighth transistor is connected to the second control node CN2; a ninth transistor M9, wherein a gate of the ninth transistor is connected to the second control node, a first terminal of the ninth transistor is connected to the pull-up control node, and a second terminal of the ninth transistor is connected to the first clock signal port; and a tenth transistor M10, wherein a gate of the tenth transistor is connected to the second control node, a first terminal of the tenth transistor is connected to the first clock signal port, and a second terminal of the tenth transistor is connected to the signal output end.

The first control module comprises an eleventh transistor M11, wherein a gate of the eleventh transistor is connected to the signal output end, a first terminal of the eleventh transistor is connected to the second clock signal port, and a second terminal of the eleventh transistor is connected to the first control node.

The second control module comprises a twelfth transistor M12, wherein a gate of the twelfth transistor is connected to the signal reset end, a first terminal of the twelfth transistor is connected to the second control node, and a second terminal of the twelfth transistor is connected to the first clock signal port.

The first state clearing module comprises: a thirteenth transistor M13, wherein a gate of the thirteenth transistor is connected to the second clock signal port, a first terminal of the thirteenth transistor is connected to the first control node, and a second terminal of the thirteenth transistor is connected to the first clock signal port.

The second state clearing module comprises: a fourteenth transistor M14, wherein a gate of the fourteenth transistor is connected to the first clock signal port, a first terminal of the fourteenth transistor is connected to the second clock signal port, and a second terminal of the fourteenth transistor is connected to the second control node.

The circuit structure as shown in FIG. 2 is explained by taking P-type transistors as an example; however, based on the description and teachings on the implementation with P-type transistors, implementations with N-type transistor can also be readily devised by persons skilled in the art without any inventive effort, all these implementations falling within the scope of the present invention. Accordingly, it should be noted that the structures of the various modules as described above are merely exemplary rather than restrictive, and any structures that may carry out the functions of the above described modules are contemplated.

Figure 3:
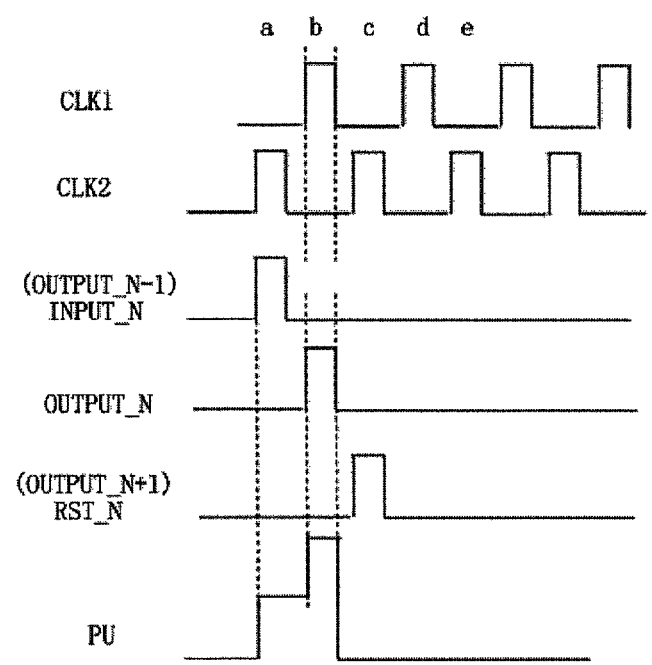
FIG. 3 illustrates a signal sequence diagram of a shift register unit according to an embodiment of the present disclosure.

FIG. 3 illustrates a signal sequence diagram of a shift register unit according to an embodiment of the present disclosure. For the purpose of making the description of the present disclosure more exhaustive, now description is made in connection with the exemplary structural diagram of FIG. 2.

As shown in FIG. 3, the first clock signal inputted to the first clock signal port CLK1 and the second clock signal inputted to the second clock signal port CLK2 are opposite in phase, and preferably each of the first and second clock signals is a signal having a duty cycle smaller than 50%. At stage a, the CLK1 end is at low level, the CLK2 end is at high level, there is a signal input at the signal input end INPUT_N (i.e. the port is at high level), and no signal is inputted at the reset signal end REST_N (the port is at low level). It should be noted that the signal input end INPUT_N is generally connected to the signal output end (OUTPUT_N−1) of the previous shift register unit. At this point, the second transistor M2 is turned on to charge the first capacitor C1, and thus the potential of the PU point is controlled at high level. At this point, as there is a signal input at the signal input end, the second control module is enabled (i.e. M12 is turned on) in order to disable the second pull-down module (CN2 point is at low level, leading to a cutoff of M9 and M10). Meanwhile, as the CLK1 end is at low level, the first pull-down module is inactive either (M5 is Cutoff).

At stage b, the CLK 1 end is at high level, the CLK2 end is at low level, no signal is inputted at the signal input end, and no signal is inputted at the reset signal end either. At this point, since the first capacitor C1 has already been charged in stage a and the potential of the PU point is thus at high level, the first transistor M1 of the pull-up module is turned on, such that the signal outputted from the signal output end OUTPUT_N is pulled up to high level. The signal output end may be connected to a gate of a pixel region in order to provide it with a gate driving signal. It is noted that due to the coupling effect of the capacitor, the potential of the PU point will rise continuously. At this time, as there is a signal output at the signal output end (OUTPUT_N end is at high level), the first control module is enabled (M11 is turned on) in order to disable the first pull-down module (CN1 is at low level, leading to a cutoff of M6 and M7); meanwhile, as CLK2 end is at low level, the second pull-down module is inactive either (M8 is cutoff).

At stage c, the CLK1 end is at low level, the CLK2 end is at high level, no signal is inputted at the signal input end, and there is a signal input at the reset signal end because there is a signal output at the signal output end (OUTPUT_N+1) of an adjacent next shift register unit. At this point, M3 and M4 in the reset module are turned on, and in turn the potentials of the PU point and the OUTPUT_N point are pulled down rapidly to low level. At the same time, as the CLK2 end is at high level, the second pull-down module is enabled (M8, M9 and M10 are turned on), ensuring that the potentials of the PU point and the OUTPUT_N point are pulled down to low level.

At stage d, the CLK1 end is at high level, the CLK2 end is at low level, no signal is inputted at the signal input end and the reset signal end, and no signal is outputted at the signal output end. At this point, the first pull-down module is enabled (M5, M6 and M7 are turned on), holding the potentials of the PU point and the OUTPUT_N point at low level. At the same time, the second state clearing module runs (M14 is turned on) to clear the previous state of the second pull-down module to prevent it from being floating which makes the circuit unstable.

Similarly, at stage e, the second pull-down module is enabled to hold the potentials of the PU point and the OUTPUT_N point at low level. At the same time, the first state clearing module runs (M13 is turned on) to clear the previous state of the first pull-down module to prevent it from being floating which makes the circuit unstable.

At subsequent stages, the CLK1 end and the CLK2 end are at high level alternately, causing the first pull-down module and the second pull-down module to run alternately to pull down the potentials of the PU point and the OUTPUT_N point to low level, until a new signal comes to the signal input end, then the above stages a-c are repeated.

Figure 4:
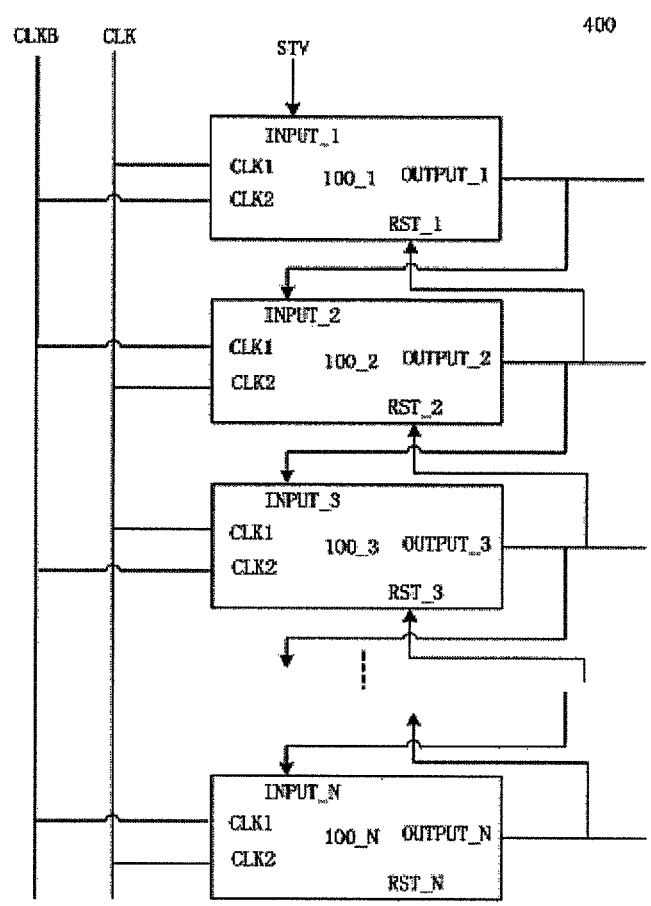
FIG. 4 illustrates a schematic structural diagram of a gate driving device according to an embodiment of the present disclosure.

FIG. 4 illustrates a schematic structural diagram of a gate driving device according to an embodiment of the present disclosure. As shown in FIG. 4, the gate driving device 400 includes a plurality of shift register units 100_1, ..., 100_N, wherein each of them may have the same structure as the shift register unit of FIG. 1. The plurality of shift register units are cascaded with each other, and a signal output end of each shift register unit, except for the first shift register unit 100_1 and the last shift register unit 100_N, is connected to an input end of an adjacent next shift register unit and to a reset signal end of an adjacent previous shift register unit. A frame start signal STV is inputted to a signal input end of said first shift register unit and a signal output end of said first shift register unit is connected to a signal input end of the second shift register unit. A signal output end of said last shift register unit is connected to a reset signal end of an adjacent previous shift register unit. The first voltage source CLK and the second voltage source CLKB as shown in FIG. 4 are opposite in phase, and thus the clock signals inputted to the first clock signal ports of two adjacent shift register units are opposite in phase, and clock signals inputted to the second clock signal ports of two adjacent shift register units are opposite in phase.

Likewise, there is disclosed a display device including the above described gate driving device.

In view of many possible embodiments in which the principles of the disclosed invention may be applied, it should be appreciated that the illustrated embodiments are merely preferred instances of the present invention and should not be considered as limiting the scope of the present invention. In contrast, the scope of the present invention is defined by the following claims. Therefore we claim all those fall within the scope of these claims and their equivalents as our invention.

The invention claimed is:

1. A shift register unit comprising:
a pull-up module;
an input module;
a reset module;
a first pull-down module;
a second pull-down module;
a first control module;
a second control module;
a first state clearing module;
and a second state clearing module; wherein
the pull-up module is connected to a first clock signal port, a pull-up control node (PU) and a signal output end, and configured to pull up a signal outputted from the signal output end to high level according to a potential of the pull-up control node and a first clock signal inputted to the first clock signal port, said pull-up control node being a connection point between the pull-up module and the input module;
the input module is connected to a signal input end and the pull-up control node, and configured to control the potential of the pull-up control node according to a signal inputted to the signal input end;
the reset module is connected to a reset signal end, the first clock signal port, the pull-up control node and the signal output end, and configured to pull down the potential of the pull-up control node and the signal outputted from the signal output end to low level according to a signal inputted to the reset signal end and the first clock signal;
the first pull-down module is connected to the first clock signal port, a second clock signal port to which a second clock signal is inputted, a first control node, the pull-up control node and the signal output end, and configured to pull down the potential of the pull-up control node and the signal outputted from the signal output end to low level when the potential of the first clock signal is high and the potential of the second clock signal is low, the first control node being a connection point between the first pull-down module and the first control module;
the second pull-down module is connected to the first clock signal port, the second clock signal port, a second control node, the pull-up control node and the signal output end, and configured to pull down the potential of the pull-up control node and the signal outputted from the signal output end to low level when the potential of the first clock signal is low and the potential of the second clock signal is high, the second control node being a connection point between the second pull-down module and the second control module;
the first control module is connected to the signal output end and the first control node, and configured to disable the first pull-down module when a signal is outputted from the signal output end;
the second control module is connected to the signal input end and the second control node, and configured to disable the second pull-down module when a signal is inputted to the signal input end;
the first state clearing module is connected to the second clock signal port and the first control node, and configured to clear the state of the first pull-down module when the potential of the second clock signal is high; and
the second state clearing module is connected to the first clock signal port and the second control node, and configured to clear the state of the second pull-down module when the potential of the first clock signal is high.

2. The shift register unit according to claim 1, said pull-up module comprises:
a first transistor, wherein a gate of the first transistor is connected to the pull-up control node, a first terminal of the first transistor is connected to the first clock signal port, and a second terminal of the first transistor is connected to the signal output end; and
a first capacitor, wherein one end of the first capacitor is connected to the pull-up control node and the other end of the first capacitor is connected to the signal output end.

3. The shift register unit according to claim 1, said input module comprises a second transistor, wherein a gate and a first terminal of the second transistor are connected to the signal input end, and a second terminal of the second transistor is connected to the pull-up control node.

4. The shift register unit according to claim 1, said reset module comprises:
a third transistor, wherein a gate of the third transistor is connected to the reset signal end, a first terminal of the third transistor is connected to the first clock signal port, and a second terminal of the third transistor is connected to the pull-up control node; and a fourth transistor, wherein a gate of the fourth transistor is connected to the reset signal end, a first terminal of the fourth transistor is connected to the signal output port, and a second terminal of the fourth transistor is connected to the first clock signal port.

5. The shift register unit according to claim 1, said first pull-down module comprises:

a fifth transistor, wherein a gate and a first terminal of the fifth transistor are connected to the first clock signal port, and a second terminal of the fifth transistor is connected to the first control node;

a sixth transistor, wherein a gate of the sixth transistor is connected to the first control node, a first terminal of the sixth transistor is connected to the pull-up control node, and a second terminal of the sixth transistor is connected to the second clock signal port; and a seventh transistor, wherein a gate of the seventh transistor is connected to the first control node, a first terminal of the seventh transistor is connected to the signal output end, and a second terminal of the seventh transistor is connected to the second clock signal port.

6. The shift register unit according to claim 1, said second pull-down module comprises:

an eighth transistor, wherein a gate and a first terminal of the eighth transistor are connected to the second clock signal port, and a second terminal of the eighth transistor is connected to the second control node;

a ninth transistor, wherein a gate of the ninth transistor is connected to the second control node, a first terminal of the ninth transistor is connected to the pull-up control node, and a second terminal of the ninth transistor is connected to the first clock signal port; and a tenth transistor, wherein a gate of the tenth transistor is connected to the second control node, a first terminal of the tenth transistor is connected to the first clock signal port, and a second terminal of the tenth transistor is connected to the signal output end.

7. The shift register unit according to claim 1, said first control module comprises an eleventh transistor, wherein a gate of the eleventh transistor is connected to the signal output end, a first terminal of the eleventh transistor is connected to the second clock signal port, and a second terminal of the eleventh transistor is connected to the first control node.

8. The shift register unit according to claim 1, said second control module comprises a twelfth transistor, wherein a gate of the twelfth transistor is connected to the signal reset end, a first terminal of the twelfth transistor is connected to the second control node, and a second terminal of the twelfth transistor is connected to the first clock signal port.

9. The shift register unit according to claim 1, said first state clearing module comprises:

a thirteenth transistor, wherein a gate of the thirteenth transistor is connected to the second clock signal port, a first terminal of the thirteenth transistor is connected to the first control node, and a second terminal of the thirteenth transistor is connected to the first clock signal port.

10. The shift register unit according to claim 1, said second state clearing module comprises:

a fourteenth transistor, wherein a gate of the fourteenth transistor is connected to the first clock signal port, a first terminal of the fourteenth transistor is connected to the second clock signal port, and a second terminal of the fourteenth transistor is connected to the second control node.

11. A gate driving device comprising a plurality of shift register units of claim 1, wherein said plurality of shift register units are cascaded, and a signal output end of each shift register unit, except for the first shift register unit and the last shift register unit, is connected to an input end of an adjacent next shift register unit and to a reset signal end of an adjacent previous shift register unit; and wherein a frame start signal is inputted to a signal input end of said first shift register unit and a signal output end of said first shift register unit is connected to a signal input end of the second shift register unit, and a signal output end of said last shift register unit is connected to a reset signal end of an adjacent previous shift register unit.

12. The gate driving device of claim 11, wherein clock signals inputted to the first clock signal ports of two adjacent shift register units are opposite in phase, and clock signals inputted to the second clock signal ports of two adjacent shift register units are opposite in phase.

13. A display device comprising the gate driving device of claim 11.

* * * * *